(12) United States Patent
Keller

(10) Patent No.: US 6,875,559 B2
(45) Date of Patent: Apr. 5, 2005

(54) METHOD OF ETCHING MATERIALS PATTERNED WITH A SINGLE LAYER 193NM RESIST

(75) Inventor: David J. Keller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 10/230,570

(22) Filed: Aug. 29, 2002

(65) Prior Publication Data

US 2004/0043333 A1 Mar. 4, 2004

(51) Int. Cl.[7] .................................................. G03F 7/40
(52) U.S. Cl. ........................................ 430/313; 430/325
(58) Field of Search ................................ 430/311, 313, 430/316, 317, 318, 325, 328

(56) References Cited

U.S. PATENT DOCUMENTS

| | | | |
|---|---|---|---|
| 5,256,245 A | 10/1993 | Keller et al. ............... 156/643 |
| 5,338,395 A | 8/1994 | Keller et al. ............... 156/643 |
| 5,346,586 A | 9/1994 | Keller ......................... 156/656 |
| 5,387,312 A | 2/1995 | Keller et al. ............... 156/662 |
| 5,492,597 A | 2/1996 | Keller ....................... 156/643.1 |
| 5,620,615 A | 4/1997 | Keller ......................... 438/720 |
| 5,644,153 A | 7/1997 | Keller ......................... 257/324 |
| 5,651,856 A | 7/1997 | Keller et al. ............. 156/643.1 |
| 5,652,170 A | 7/1997 | Keller et al. .................. 437/60 |
| 5,700,580 A | 12/1997 | Becker et al. .............. 428/446 |
| 5,756,216 A | 5/1998 | Becker et al. .............. 428/446 |
| 5,811,329 A | 9/1998 | Ahmad et al. ............... 438/233 |
| 5,858,865 A | 1/1999 | Juengling et al. ........... 438/585 |
| 5,906,950 A | 5/1999 | Keller et al. ................. 438/719 |
| 5,923,977 A | 7/1999 | Ahmad et al. ............... 438/262 |
| 5,968,844 A | 10/1999 | Keller ......................... 438/695 |
| 6,010,930 A | 1/2000 | Keller et al. ................. 438/238 |
| 6,018,173 A | 1/2000 | Keller et al. ................. 257/296 |
| 6,060,783 A | 5/2000 | Juengling et al. ........... 257/752 |
| 6,069,087 A | 5/2000 | Keller et al. ................. 438/706 |
| 6,136,637 A | 10/2000 | Ahmad et al. ............... 438/233 |
| 6,165,827 A | 12/2000 | Ahmad et al. ............... 438/231 |
| 6,319,779 B1 | 11/2001 | Ahmad et al. ............... 438/275 |
| 6,333,539 B1 | 12/2001 | Ahmad et al. ............... 257/344 |
| 6,346,439 B1 | 2/2002 | Ahmad et al. ............... 438/231 |
| 6,432,765 B1 | 8/2002 | Keller et al. ................. 438/238 |
| 6,583,065 B1 * | 6/2003 | Williams et al. ............ 438/714 |
| 2003/0132197 A1 * | 7/2003 | Ke et al. ........................ 216/67 |
| 2003/0222345 A1 * | 12/2003 | Kenyon et al. .............. 257/751 |
| 2004/0009437 A1 * | 1/2004 | Chun et al. .................. 430/315 |

* cited by examiner

*Primary Examiner*—Kathleen Duda
(74) *Attorney, Agent, or Firm*—Fletcher Yoder

(57) ABSTRACT

A technique for etching with a single layered patterned photomask at wavelengths of 193 nanometers or less. Specifically, a method for etching a bottom anti-reflectant coating layer that utilizes a combination of $CF_4$, $CH_2F_2$, and $O_2$ to produce a stabilized pattern in the photoresist layer. The etching process results in a structure with a defined pattern having minimal defects and that maintains integrity through the remainder of the etching. A second etching process implementing an etchant having a high dielectric to photoresist selectivity may be used to further etch underlying layers.

44 Claims, 2 Drawing Sheets

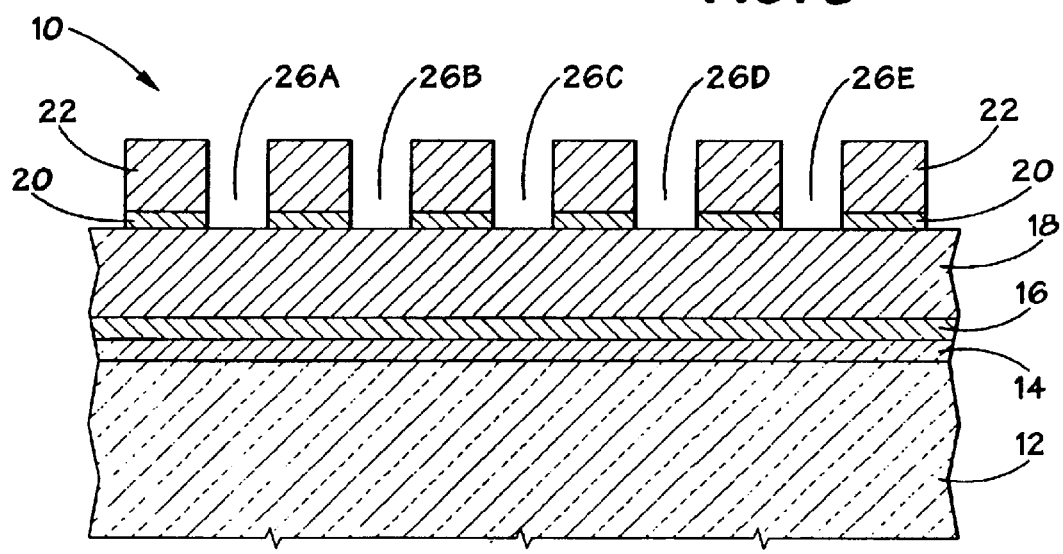
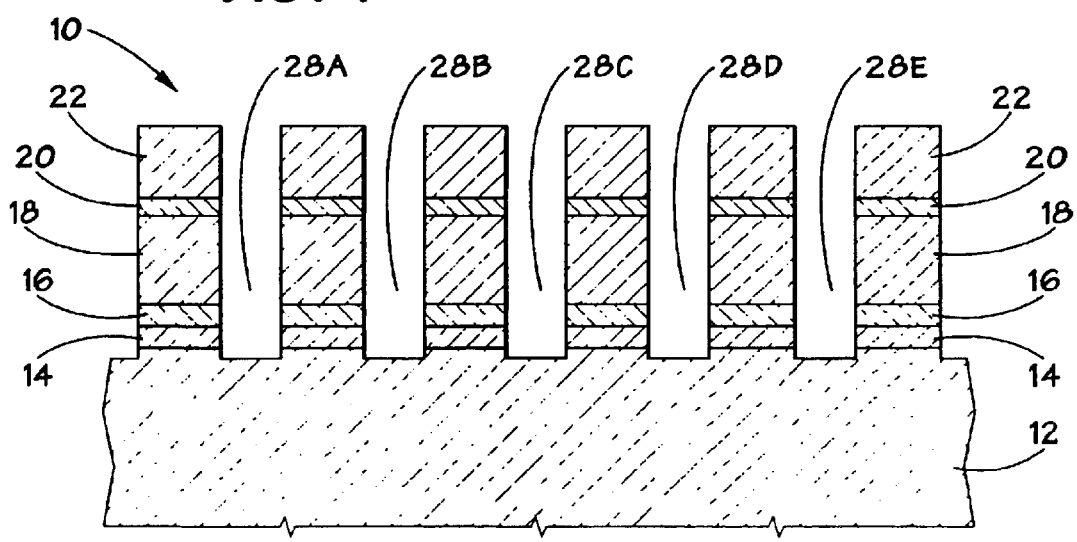

METHOD OF ETCHING MATERIALS PATTERNED WITH A SINGLE LAYER 193NM RESIST

BACKGROUND OF THE INVENTION

1. Field of the Invention

This present invention relates generally to the field of electronic circuitry and, more specifically, to techniques for fabricating integrated circuits implementing small wavelength photolithography technology.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled circuits are used in a wide variety of applications throughout the world. Such applications include personal computers, control systems, telephone networks, and a host of other consumer products. A personal computer or control system is made up of various different components that handle different functions for the overall system. By combining these different components, various consumer products and systems are able to meet the specific needs of an end user. As is well known, microprocessors are essentially generic devices that perform specific functions under the control of software programs. These software programs are generally stored in one or more memory devices that are coupled to the microprocessor and/or other peripherals.

The memory devices generally include many different types of integrated circuits that are typically fabricated from one or more semiconductor materials. The integrated circuits work together to enable the memory device to carry out and control various functions within an electronic device. With the current trend in decreasing the "footprint" or overall size of the electronic devices, the different components of the electronic devices, such as the memory devices, may be reduced to accommodate these requirements. Accordingly, the integrated circuits that make up the memory device may be designed to consume less space. The reduction in size of these integrated circuits is a key component to the technological development of many devices containing electrical components. Accordingly, the fabrication processes that are used to form these integrated circuits have experienced dramatic changes.

Integrated circuits, such as memory devices, are typically fabricated on a wafer surface through any number of manufacturing processes, such as layering, doping, and patterning. Layering generally refers to adding material to the surface of the wafer by a growth process, such as oxidation, or through a deposition process, such as chemical vapor deposition (CVD) or physical vapor deposition (PVD). Doping generally refers to the process of implanting dopants into the wafer surface or overlying layer and may be used to increase the current carrying capacity of a region of the wafer or overlying layer of material. The doping process may be implemented before a layer is formed, between layers, or even after the layer are formed. Generally, the doping process may be accomplished through an ion implantation process, using boron or other similar dopants, or through thermal diffusion, for example.

Patterning refers to a series of steps that result in the removal of selected portions of layers or underlying wafer material. After removal of the selected portions of the layer(s), via a wet or dry etch process, a pattern of the layer is left on the wafer surface. The removal of material allows the structure of the device to be formed by providing holes or windows between layers or by removing unwanted layers. Patterning sets the critical dimensions of the integrated circuit structures being fabricated. Disadvantageously, errors in the patterning and removal process may result in changes and failures in the electrical characteristics in the device.

One commonly used patterning technique is photolithography. In using photolithography, a pattern may be formed by using a photomask to expose certain regions of a radiation sensitive material, such as a photoresist or resist, to a certain wavelength of light. Typically, the radiation source provides UV light to pattern the resist. However, certain resists may also be implemented using other energy types, such as X-rays. Exposure to the radiation changes the structure of the resist. If the resist is a negative resist, then the resist become polymerized where it is exposed. If the resist is a positive resist, the exposed region of resist becomes divided or softened. After the exposure to the radiation, the unpolymerized regions may be dissolved by applying an appropriate solvent.

To fabricate an appropriately sized structure, a bottom anti-reflectant coating (BARC) layer may be implemented underneath the resist to enhance the photolithography process. The BARC layer is used to absorb the radiation generated by the source, thereby reducing development of the photoresist caused by reflections from underlying layers. By providing an underlying layer for absorbing the radiation, the patterned structure is typically more defined with fewer defects than the methods wherein a BARC layer is not included. Once the resist has been patterned, the resist layer may be removed to allow the underlying structure to be developed. While it may be desirable to retain the BARC layer, it is typically desirable to remove the BARC layer through an etching process.

After patterning of the photoresist layer, various etchants may be selected to implement the removal of selected portions of material from the surface of the structure. Selectivity relates to the preservation of the surface underlying the etched material layer. The selectivity is generally expressed as a ratio of the etch rate of the material layer to the etch rate of the underlying surface. Further, selectivity may be used to refer to the removal rate of the photoresist with respect to the underlying material layer. As can be appreciated, as the material layer is being etched through the openings patterned in the photoresist, some of the photoresist may also be removed. The selectivity should be high enough to ensure that the photoresist layer is not removed before the etched patterns in the material layer.

One of the objectives in photolithography is to transfer a well-defined pattern with minimal ambiguities or anomalies. One technique that may be used to develop the respective gates, devices, or desired structures is to implement a multi-layer resist scheme. The multi-layer resist scheme employs multiple layers of resist for each gate or structure. This process employs different photoresists and etchants to ensure that the gate or structure is formed correctly. However, with the multi-layer resist process, the resulting gate or structure is more expensive because the various layers of resist may increase the number of steps in the process, which increases the time required to fabricate the device. This increase in processing time has a further negative effect of decreasing the quantity of devices that may be produced over a period of time, such as a week or month. Furthermore, the additional fabrication process steps increase the likelihood of potential errors by complicating the method of making the device.

To meet the ever-increasing demand for smaller integrated circuit structures, smaller wavelength photolithography techniques have been developed. One such technique implements 193 nm technology. That is to say that the photoresist used to pattern the underlying materials is developed by exposure to a radiation source having a wavelength of 193 nm. While 193 nm technology allows the resist to be patterned with smaller structures, the resist does not generally retain a crisp pattern throughout the entire etch process. Instead, the 193 nm resist tends to wrinkle, shred, and bend during the etch process. To mitigate some of these effects, an etchant to which the 193 nm photoresist has a higher selectivity could be implemented. However, in the 193 nm process, increased resist selectivity produces large striations through the resist. Regardless of whether the defects include wrinkles, striations, or other anomalies, defects in the photoresist are undesirable, since the defects may be transferred to the underlying layers. Disadvantageously, defects in the underlying layers may result in failures of the structure or integrated circuit device being fabricated.

BRIEF DESCRIPTION OF THE DRAWINGS

Advantages of the invention may become apparent upon reading the following detailed description and upon reference to the drawings in which:

FIGS. 1–4 illustrate an exemplary process for fabricating materials by utilizing small wavelength photolithography technology in accordance with the present techniques.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
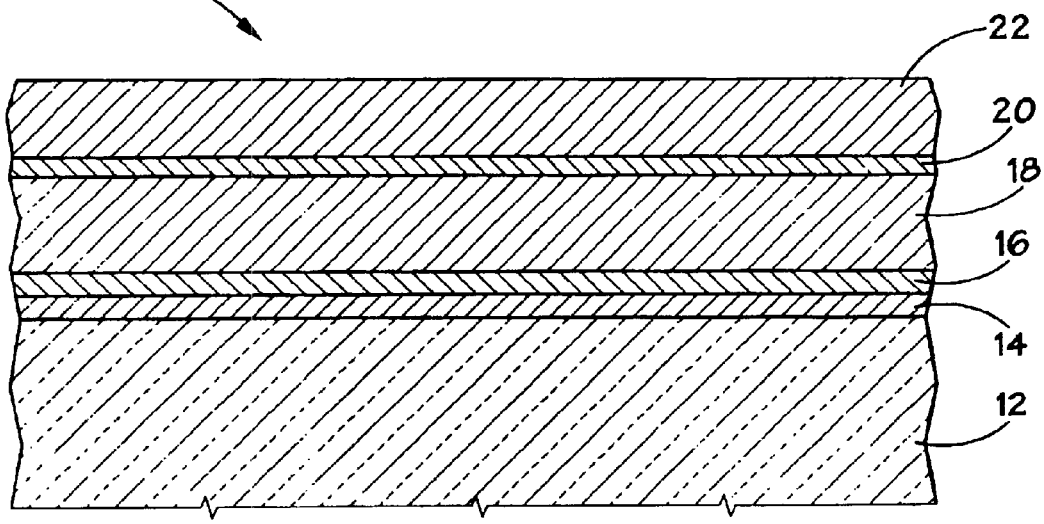

Turning now to the drawings and referring initially to FIG. 1, a partial cross sectional view of a structure 10 is illustrated. The structure 10 may be formed during the fabrication of an integrated circuit device, such as a memory device. More specifically, the structure 10 may be fabricated to form wordlines of a memory array, as described in the present exemplary embodiment. As can be appreciated, tungsten (W) may be implemented to fabricate the wordlines. While this process may be used specifically for fabricating tungsten wordlines, as described further below, this process may be used to etch other films, such as $SiO_2$, Al, Ti, Sn, BPSG, or films to be patterned under a resist, such as a resist used in 193 nm photolithography.

The structure 10 generally includes a substrate 12, which may be a wafer, a portion of a wafer, a polysilicon layer, or a combination of other layered materials. In one exemplary embodiment, the substrate 12 may include a silicon (Si) wafer having a polysilicon layer disposed thereon. The polysilicon layer may be disposed at a thickness of about 250 angstroms to about 750 angstroms, for example. More specifically, the polysilicon layer may be disposed at a thickness of about 500 angstroms. In a second exemplary embodiment, the substrate 12 may include a silicon (Si) wafer having a gate oxide layer disposed thereon at a thickness of about 20 angstroms to about 60 angstroms, for example. More specifically, the gate oxide layer may be disposed at a thickness of about 40 angstroms.

A barrier layer 14 may be disposed over the substrate 12. The barrier layer 14 may be a conductive nitride layer, a conductive oxide layer, or any other similar material. More specifically, the barrier layer 14 may be a tungsten nitride, a copper nitride, an aluminum nitride, a titanium nitride, or any other conductive nitride material. Similarly, the barrier layer 14 may be a tungsten oxide, a copper oxide, an aluminum oxide, a titanium oxide, or other conductive oxide material. The thickness of the barrier layer 14 may be about 50 angstroms to about 150 angstroms, for example. In one embodiment, the barrier layer 14 may be a tungsten nitride layer having a thickness of about 100 angstroms.

Following the barrier layer 14, a conductive layer 16 may be disposed over the substrate 12 and the barrier layer 14. The conductive layer 16 may be tungsten, copper, aluminum, tin, titanium, or any other suitable metal or conductive material. Generally, the conductive layer 16 may be disposed at a thickness in the range of about 100 angstroms to about 300 angstroms, for example. In one specific embodiment, the conductive layer 16 may be a tungsten layer having a thickness of about 200 angstroms.

A dielectric layer 18 may be disposed over the conductive layer 16. The dielectric layer 18 may be a nitride layer, an oxide layer, or a layer of any other suitable non-conductive material. The dielectric layer 18 may be disposed at a thickness in the range of about 1000 angstroms to about 2000 angstroms, for example. In one specific embodiment, the dielectric layer 18 may comprise a nitride layer having a thickness of about 1500 angstroms.

Overlying the dielectric layer 18 may be a bottom anti-reflectant coating (BARC) layer 20. As can be appreciated, the BARC layer 20 prevents development of the bottom surface of an overlying photoresist layer that may occur due to light reflecting off of a reflective surface, such as a metal layer, under the layer of photoresist. The BARC layer 20 essentially provides a non-reflective surface to reduce reflective development of the photoresist. The BARC layer 20 may have a thickness in the range about 200 angstroms to about 500 angstroms, for example. In one embodiment, the bottom anti-reflectant coating layer 20 may have a thickness of about 350 angstroms. A layer of resist 22 may be disposed over the bottom anti-reflectant coating layer 20 at a thickness of about 3000 angstroms to about 6000 angstroms, for example. The resist 22 may be designed to react to a source radiating at a wavelength of 193 nanometers or less, for example.

To begin the process of forming a device 10, a pattern may be formed using photolithography technology. In this process, the resist 22 is subjected to a radiation from a source through a photomask. The resist 22 used in the photolithography process may be designed for wavelengths of 193 nanometers or less. Accordingly, a source capable of producing UV light at a wavelength of 193 nm may be implemented. As previously described, exposure to the radiation changes the structure of the resist 22 in a way that depends on whether the resist 22 is a negative resist or a positive resist. If the resist 22 is a negative resist, the resist becomes polymerized where it is exposed. If the resist 22 is a positive resist, the exposed region of resist becomes divided or softened.

Figure 2:
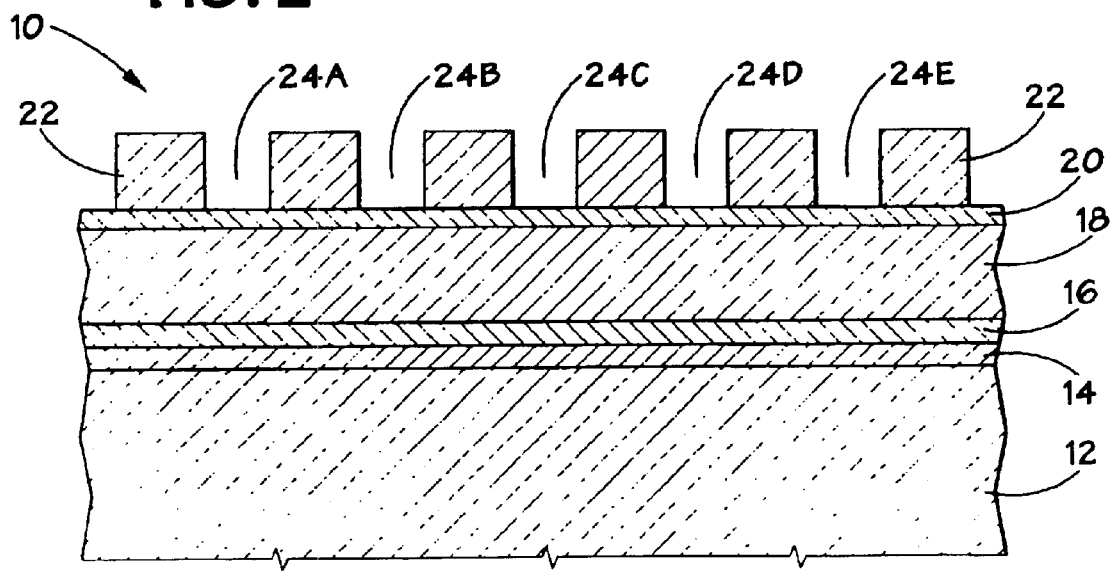

After the exposure to the radiation, the unpolymerized regions may be dissolved by applying an appropriate solvent. The resist 22 may be patterned to form windows 24A–24E as depicted in FIG. 2. The dimensions of the windows 24A–24E may vary depending on the design of the specific structure 10 to be fabricated. In this process, optical diffraction or optical phase shifting in the photomask may be used to further enhance the process. As previously described, the BARC layer 20 may prevent reflective patterning of the resist 22, such that the structures patterned in the resist have a high resolution. The pattern that is developed in the resist 22 may be transferred to an underlying layer through etching processes, as described further below. Advantageously, by applying the techniques described herein, a single layer of photoresist 22 may be implanted through completion of the etch process.

After patterning the desired structure into the resist layer 22, the underlying material layers may be etched to transfer the pattern from the resist into the underlying layers. However, as previously discussed, conventional etching techniques may result in shredding, tearing, shrinking, striation, and/or the formation of other disadvantageous anomalies in the 193 nm resist 22. Accordingly, a technique for stabilizing the resist 22 may be implemented to reduce the likelihood of damage to the resist layer 22 during the etch process. After stabilizing the resist 22, a second step may be implemented to complete the etch process.

To etch the BARC layer 20, a first etchant having a particular chemical composition that not only etches the BARC layer 20, but advantageously stabilizes the resist layer 22 may be implemented. FIG. 3 illustrates the structure 10, after the BARC layer 20 has been etched to form windows 26A–26E. To reduce clipping of the dielectric layer 18 during the etching of the BARC layer 20, the etchant may have a 1:1 selectivity of dielectric 18 to resist 22. Specifically, implementing an etchant including a fluorine source, a polymer source, and an oxygen source to etch the BARC layer 20 may be advantageous. With the addition of a fluorine source, a polymer source, and an oxygen source to the bottom anti-reflectant coating etchant, the BARC layer 20 may be etched to form the same pattern formed in the resist 22, while also stabilizing the structure patterned in the layer of resist 22. This stabilization allows the resist 22 to be more resistant to the remainder of the etching processes.

In one specific embodiment, the bottom anti-reflectant coating etchant may be a fluoride source with a polymer source and oxygen source added to it. More specifically, the bottom anti-reflectant coating etchant may be a $CF_4$ source with $CH_2F_2$ as a polymer source and $O_2$ as the oxygen source. In this embodiment, certain ratios of the $CF_4$, $CH_2F_2$, and $O_2$ are able to act as a good bottom anti-reflectant coating etchant that stabilizes the resist 22 to allow the pattern formed in the resist 22 to remain intact throughout the remainder of the etch process. For example, the bottom anti-reflectant coating etchant may include the ratios of $CF_4$ to $CH_2F_2$ to $O_2$ in a range from about 4:4:1 to about 5:1:1.

In this process, the chamber pressure, plasma generator, substrate bias, and chemical flow rates may vary depending on the desired layers or device structure to be fabricated. One possible embodiment may implement a chamber pressure from about 4 to about 15 millitorr and, more specifically, about 5 millitorr. The plasma generator may operate in a range of about 500 to about 1500 watts for example, and, more specifically, about 1000 watts. The substrate may be biased by a source in the range of about 100 to about 350 watts, for example and, more specifically, about 250 watts. In addition, the flow rate of the BARC etch may be in a range between about 10 and about 30 standard cubic centimeters per minute (sccm) for example and, more specifically, about 20 sccm. The flow rate of the polymer source may be between about 10 and about 30 sccm for example and, more specifically, about 20 sccm. The flow rate of the oxide source may be in a range between about 2 and about 10 sccm for example and, more specifically, about 5 sccm. The duration time may be in a range between about 5 to about 15 seconds for example and, more specifically, about 10 seconds. While these settings are included as one specific embodiment, other quantities may be used in the process or chemistries may change for other embodiments depending upon the materials used and the thickness of the materials.

Following the bottom anti-reflectant coating etch process, the dielectric layer 18 and other remaining layers may be etched. Advantageously, because of the stabilization process described above, the pattern formed in the resist 22 and BARC layer 20 (FIG. 3) will maintain integrity. This etching process may implement a second etchant having a high selectivity of nitride to resist so that the remaining layers may be etched quickly and evenly with little or no striation in the structure. The particular etchant used for this process may depend on the materials used to form the structure 10, such as nitride/tungsten/tungsten nitride/polysilicon. FIG. 4 illustrates the structure 10, after the remaining materials have been etched. In this structure, the windows 28A–28E are formed and retain the pattern that was initially formed with the resist 22. As can be appreciated by those skilled in the art, the resulting structure may be implemented as wordlines in a memory array.

To etch the remaining layers, an etchant having a high selectivity of dielectric to resist is advantageously implemented. Further, the remaining layers may be etched in the substantial absence of oxygen. In one embodiment, an etchant having a fluorine source, a polymer source, or a combination of the fluorine and polymer sources. The etchant may include a combination having a high dielectric to resist ratio, such as a high nitride to resist ratio, a high oxide to resist ration, or any other suitable etchant. The selection of etchant depends on the material exposed and the underlying layer or layers being etched. For example, the etchant may include the ratios of $CF_4$ to $CH_2F2$ to $O_2$ in a range from about 4:8:1 to about 5:1:1. If the underlying layers include nitride layers or layers that etch at the same rate as nitride layers, for example, then a nitrate etchant is one alternative process that may be used. A nitride etchant allows the pattern in the resist 22 to remain relatively unaltered as it is transferred to the nitride layer. This enables the etching process to retain the desired column structure so that little striation occurs in the columns as depicted in windows 28A–28E.

In one exemplary embodiment, the dielectric layer 18 comprises a nitride layer. An etchant having a high polymer source to fluorine source may be implemented. This particular etchant composition generally has a high nitride to resist selectivity. In one specific embodiment, an etchant having a high $CH_2F_2$ to $CF_4$ ratio may be implemented. As a result of this dielectric etching process, the materials etched completely while a portion of the resist 22 remains. The resulting profiles are square with little sidewall striations. If the pattern is being used to form word lines with a nitride cap, the profiles are clearly defined as windows 28A–28E.

To facilitate the dielectric etching process, the chamber pressure, plasma generator, substrate bias, and chemical flow rates may vary depending on the desired layers or device structure to be fabricated. One possible embodiment may have the chamber pressure from about 4 to about 15 millitorr and, more specifically, about 5 millitorr. The plasma generator may be in a range of about 500 to about 1500 watts and, more specifically, about 1000 watts. The substrate may be biased by a source in a range between about 100 to about 350 watts and, more specifically, about 250 watts. Furthermore, the flow rate of the dielectric etchant may be in a range between about 10 and about 30 sccm and, more specifically, about 20 sccm. The elapsed time for the dielectric etching process may be within a range from about 50% of the end point to the end point plus some additional time to over etch the wafer. While these settings are included for this specific embodiment, other settings may be used as the processes or chemistries may change for different embodiments as long as the results are similar.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method for etching wordlines comprising the acts of:
   (a) stabilizing a layer of patterned photoresist overlying a plurality of layers to be etched, wherein stabilizing the layer of patterned photoresist uses a fluorine source, a polymer source, and an oxygen source; and
   (b) etching the plurality of layers through the stabilized layer of patterned photoresist using an etchant more selective to the plurality of layers than to the stabilized layer of patterned photoresist to produce the wordlines.

2. The method, as set forth in claim 1, wherein the photoresist comprises a 193 nanometer photoresist.

3. The method, as set forth in claim 1, wherein the plurality of layers comprises a metal layer disposed over a gate polysilicon layer.

4. The method, as set forth in claim 3, wherein the plurality of layers comprises a metal nitride layer disposed over the gate polysilicon layer, a metal layer disposed over the metal nitride layer, and a dielectric layer disposed over the metal layer.

5. The method, as set forth in claim 4, wherein the dielectric layer comprises a nitride.

6. The method, as set forth in claim 4, wherein a bottom anti-reflective coating layer is disposed over the dielectric layer.

7. The method, as set forth in claim 1, wherein the plurality of layers comprise a bottom anti-reflectant coating layer under the photoresist.

8. The method, as set forth in claim 7, wherein act (a) comprises the act of etching through the bottom anti-reflectant coating layer.

9. The method, as set forth in claim 1, wherein act (a) comprises the act of stabilizing the layer of patterned photoresist using $CF_4/CH_2F_2/O_2$.

10. The method, as set forth in claim 1, wherein act (b) comprises the act of etching the plurality of layers using $CF_4/CH_2F_2$.

11. The method, as set forth in claim 1, wherein act (b) comprises the act of etching the plurality of layers using a fluorine source and a polymer source.

12. The method, as set forth in claim 11, wherein act (b) comprises the act of etching the plurality of layers in substantial absence of oxygen.

13. The method, as set forth in claim 1, wherein the acts are performed in the recited order.

14. A method for etching using photolithography having a wavelength of 193 nm or less comprising the acts of:
   (a) stabilizing a layer of patterned photoresist overlying at least one layer to be etched, wherein stabilizing the layer of patterned photoresist uses a fluorine source, a polymer source, and an oxygen source; and
   (b) etching the at least one layer to be etched through the stabilized layer of patterned photoresist using an etchant more selective to the at least one layer than to the stabilized layer of patterned photoresist.

15. The method, as set forth in claim 14, wherein the photoresist comprises a 193 nm photoresist.

16. The method, as set forth in claim 14, wherein the plurality of layers comprise a bottom anti-reflectant coating layer under the photoresist.

17. The method, as set forth in claim 16, wherein act (a) comprises the act of etching through the bottom anti-reflectant coating layer.

18. The method, as set forth in claim 14, wherein act (a) comprises the act of stabilizing the layer of patterned photoresist using $CF_4/CH_2F_2/O_2$.

19. The method, as set forth in claim 14, wherein act (b) comprises the act of etching the at least one layer using $CF_4/CH_2F_2$.

20. The method, as set forth in claim 14, wherein the (b) comprises the act of etching the at least one layer using a fluorine source and a polymer source.

21. The method, as set forth in claim 20, wherein act (b) comprises the act of etching the at least one layer in substantial absence of oxygen.

22. The method, as set forth in claim 14, wherein the acts are performed in the recited order.

23. A method for etching wordlines by using photolithography having a wavelength of 193 nm or less, the method comprising the acts of:
   (a) stabilizing a layer of patterned photoresist overlying a plurality of layers to be etched by using a gas comprising carbon, wherein stabilizing the layer of patterned photoresist uses a fluorine source, a polymer source, and an oxygen source; and
   (b) etching the plurality of layers through the stabilized layer of patterned photoresist using an etchant more selective to the plurality of layers than to the stabilized layer of patterned photoresist to produce the wordlines.

24. The method, as set forth in claim 23, wherein the photoresist comprises a 193 nm photoresist.

25. The method, as set forth in claim 23, wherein the plurality of layers comprises a metal layer disposed over a gate polysilicon layer.

26. The method, as set forth in claim 25, wherein the plurality of layers comprises a metal nitride layer disposed over the gate polysilicon layer, a metal layer disposed over the metal nitride layer, and a dielectric layer disposed over the metal layer.

27. The method, as set forth in claim 26, wherein the dielectric layer comprises a nitride.

28. The method, as set forth in claim 26, wherein a bottom anti-reflectant coating layer is disposed over the dielectric layer.

29. The method, as set forth in claim 23, wherein the plurality of layers comprises a bottom anti-reflectant coating layer under the photoresist.

30. The method, as set forth in claim 29, wherein act (a) comprises the act of etching through the bottom anti-reflectant coating layer.

31. The method, as set forth in claim 23, wherein act (a) comprises the act of stabilizing by using $CF_4/CH_2F_2/O_2$.

32. The method, as set forth in claim 23, wherein act (b) comprises the act of etching the plurality of layers using $CF_4/CH_2F_2$.

33. The method, as set forth in claim 23, wherein act (b) comprises the act of etching the plurality of layers using a fluorine source and a polymer source.

34. The method, as set forth in claim 33, wherein act (b) comprises the act of etching the plurality of layers in substantial absence of oxygen.

35. The method, as set forth in claim 23, wherein the acts are performed in the recited order.

36. A method for etching using photolithography having a wavelength of 193 nm or less, the method comprising the acts of:

(a) stabilizing a layer of patterned photoresist overlying at least one layer to be etched using a fluorine source, a polymer source, and an oxygen source; and (b) etching the at least one layer to be etched through the stabilized layer of patterned photoresist using an etchant more selective to the at least one layer than to the stabilized layer of patterned photoresist.

37. The method, as set forth in claim 36, wherein the photoresist comprises a 193 nm photoresist.

38. The method, as set forth in claim 36, wherein the plurality of layers comprises a bottom anti-reflectant coating layer under the photoresist.

39. The method, as set forth in claim 38, wherein act (a) comprises the act of etching through the bottom anti-reflectant coating layer.

40. The method, as set forth in claim 36, wherein act (a) comprises the act of the layer of patterned photoresist stabilizing by using $CF_4/CH_2F_2/O_2$.

41. The method, as set forth in claim 36, wherein act (b) comprises the act of etching the at least one layer using $CF_4/CH_2F_2$.

42. The method, as set forth in claim 36, wherein act (b) comprises the act of etching the at least one layer using a fluorine source and a polymer source.

43. The method, as set forth in claim 42, wherein act (b) comprises the act of etching the at least one layer in substantial absence of oxygen.

44. The method, as set forth in claim 36, wherein the acts are performed in the recited order.

* * * * *